United States Patent [19]

Ho

[11] Patent Number: 4,898,841
[45] Date of Patent: Feb. 6, 1990

[54] METHOD OF FILLING CONTACT HOLES FOR SEMICONDUCTOR DEVICES AND CONTACT STRUCTURES MADE BY THAT METHOD

[75] Inventor: Vu Q. Ho, Kanata, Canada

[73] Assignee: Northern Telecom Limited, Montreal, Canada

[21] Appl. No.: 207,568

[22] Filed: Jun. 16, 1988

[51] Int. Cl.[4] .......................................... H01L 21/285
[52] U.S. Cl. .................................... 437/200; 437/192; 437/187; 148/DIG. 19
[58] Field of Search ................... 357/71; 148/DIG. 19, 148/135; 437/200, 203, 192, 187

[56] References Cited

U.S. PATENT DOCUMENTS

| | | | |
|---|---|---|---|
| 4,507,853 | 4/1985 | McDavid | 357/71 |
| 4,586,968 | 5/1986 | Coello-Vera | 148/DIG. 19 |
| 4,624,864 | 11/1986 | Hartmann | 437/192 |
| 4,630,357 | 12/1986 | Rogers et al. | 437/192 |
| 4,640,738 | 2/1987 | Fredericks et al. | 437/200 |
| 4,641,420 | 2/1987 | Lee | 148/DIG. 19 |
| 4,656,732 | 4/1987 | Teng et al. | 357/71 |
| 4,666,737 | 5/1987 | Gimpelson et al. | 437/192 |
| 4,691,435 | 9/1987 | Anantha et al. | 357/71 |
| 4,720,908 | 1/1988 | Wills | 437/192 |

FOREIGN PATENT DOCUMENTS

| | | | |
|---|---|---|---|
| 0161023 | 9/1984 | Japan | 437/187 |
| 0214449 | 9/1986 | Japan | 437/203 |
| 0086818 | 4/1987 | Japan | 437/203 |
| 0205647 | 9/1987 | Japan | 437/187 |
| 0117447 | 5/1988 | Japan | 437/203 |

OTHER PUBLICATIONS

Silicon Processing For The VLSI Era, Tauber et al., pp. 391-392, 399-405.
"A Planar Metallization Process-Its Application to Tri-Level Aluminum Interconnection" by Moriya, et al., IEEE/1983, pp. 550-553.
Silicon Processing For The VLSI Era, S. Wolf and R. N. Tauber, 1986, pp. 169-173, 357-359, 377-378, 391-393, 397-400.

Primary Examiner—Brian E. Hearn
Assistant Examiner—Tuan Nguyen
Attorney, Agent, or Firm—C. W. Junkin

[57] ABSTRACT

In a method of filling a contact hole of a semiconductor device, a layer of conducting material, such as a metal silicide, is formed on side walls of the contact hole, and metal is selectively deposited on the bottom of the contact hole and on the layer of metal silicide on the side walls of the contact hole to substantially fill the contact hole. The method provides a contact structure comprising a contact region of the semiconductor device defining the bottom of the contact hole, a layer of conducting material, such as a metal silicide, on the side walls of the contact hole, and a metal plug substantially filling the contact hole. The metal plug adheres to the layer of metal silicide on the side walls of the contact hole and to the contact region defining the bottom of the contact hole.

4 Claims, 3 Drawing Sheets

METHOD OF FILLING CONTACT HOLES FOR SEMICONDUCTOR DEVICES AND CONTACT STRUCTURES MADE BY THAT METHOD

FIELD OF THE INVENTION

This invention relates generally to electrical contacts for semiconductor devices and more particularly to methods of filling contact holes and contact structures made by those methods.

BACKGROUND OF THE INVENTION

In the fabrication of a semiconductor device, electrical contacts are typically made by opening contact holes in a dielectric isolation layer to expose regions of the semiconductor device to which electrical contact must be made, and depositing a layer of metal over each contact hole. The layer of metal extends from the bottom of the hole, up a side wall of the hole and over the dielectric isolation layer to another contact hole or to a contact pad overlying the dielectric isolation layer.

The layer of metal, typically Al-Si, is deposited by DC magnetron evaporation or electron beam evaporation. Such physical deposition techniques provide good coverage for horizontal surfaces, but do not always provide good coverage for vertical surfaces. Thus, the metal layer may be unacceptably thin or interrupted at the side walls of contact holes when these deposition techniques are used, and the required electrical contacts may be unreliable or defective.

Metal coverage at the side walls may be improved by sloping the side walls, either by etching the dielectric isolation layer adjacent to the contact holes or, where the dielectric isolation layer is formed from a glass, by heating the glass to cause it to reflow. However, sloping side walls increase the surface area required for the contact holes, thereby increasing the total area required for the device. Moreover, heating the device to a temperature sufficient for glass reflow causes unwanted diffusion of dopants within the semiconductor device.

Alternatively, the problem of metal coverage at the side walls may be avoided by filling the contact holes with metallic plugs and depositing a metal such as Al-Si over the dielectric isolation layer and metallic plugs to define interconnections and contact pads.

The metallic plugs may be formed by employing chemical vapour deposition (CVD) to deposit a thick conformal layer of a refractory metal such as tungsten over the entire device to a thickness sufficient to fill the contact holes, and etching back the tungsten to expose the dielectric isolation layer adjacent the contact holes while leaving tungsten plugs in the contact holes. Unfortunately, the conformal CVD and etch back processes are relatively slow, and the deposited tungsten layer must be sufficiently thick to fill the largest contact holes. Consequently, this method of filling contact holes is time consuming, particularly where relatively large contact holes are required. Moreover, the tungsten does not bond well to the side walls of the contact holes and may heave during subsequent process steps, making the contact unreliable or defective.

In an alternative method of filling contact holes, selective CVD may be employed to deposit a refractory metal such as tungsten only on exposed silicon at the bottoms of the contact holes. The selective CVD may be continued until the tungsten fills the contact holes. Because the tungsten is selectively deposited in the contact holes, etching of unwanted tungsten is required only when one or more of the contact holes is overfilled. However, this alternative method is also time consuming since the tungsten is selectively deposited only at the bottom of the contact holes and not at the side walls. Moreover, the tungsten does not bond well to the side walls of the contact holes as in the previous alternative method.

SUMMARY OF THE INVENTION

It is an object of the present invention to provide a method of filling contact holes which reduces or overcomes the problems encountered in the methods described above.

It is another object of the present invention to provide a novel contact structure for semiconductor devices.

To this end, the present invention provides a method of filling a contact hole of a semiconductor device, said contact hole extending through a dielectric isolation layer of the semiconductor device to expose a contact region of the semiconductor device, the exposed contact region defining a bottom of the contact hole, and the dielectric isolation layer defining side walls of the contact hole, the method comprising:

forming a layer of conducting material which adheres to the side walls of the contact hole; and selectively depositing metal on the bottom of the contact hole and on the layer of conducting material on the side walls of the contact hole to substantially fill the contact hole.

The present invention further provides a contact structure for a semiconductor device comprising a semiconductor substrate, a dielectric isolation layer on said substrate and a contact hole extending through the dielectric isolation layer, the dielectric isolation layer defining side walls of the contact hole, the contact structure comprising:

a contact region of the semiconductor device defining a bottom of the contact hole;

a layer of conducting material adhering to the side walls of the contact hole; and a metal plug substantially filling the contact hole, said metal plug adhering to the layer of conducting material on the side walls of the contact hole and to the contact region defining the bottom of the contact hole.

The layer of conducting material adhering to the side walls of the contact hole improves the adherence of the metal plug which fills the contact hole to the side walls of the contact hole. Moreover, the selective deposition of metal on the layer of conducting material thickens the metal inward from the side walls of the contact hole as well as upward from the bottom of the contact hole. Consequently, the metal fills the contact hole more rapidly than in methods in which the metal thickens only upward from the bottom of the contact hole. As the metal deposition is selective, no removal of unwanted metal is required unless the contact hole is overfilled.

Preferably, the layer of conducting material is a layer of metal silicide formed on the side walls of the contact hole by forming a conformal layer of metal silicide on the bottom of the contact hole, the side walls of the contact hole and an upper surface of the dielectric isolation layer and preferentially removing the metal silicide from the bottom of the contact hole and the upper surface of the dielectric isolation layer.

The conformal layer of metal silicide may be formed by chemical vapour deposition or by bias sputtering and is preferably between 500 angstroms and 2000 angstroms thick.

The metal silicide may be preferentially removed from the bottom of the contact hole and the upper surface of the dielectric isolation layer by anisotropically etching the metal silicide, for example by reactive ion etching.

Preferably, the metal silicide is a refractory metal silicide, for example tungsten silicide, titanium silicide, molybdenum silicide, tantalum silicide, platinum silicide, chromium silicide, palladium silicide or nickel silicide. Alternatively, the metal silicide may be a silicide of an alloy comprising a refractory metal and at least one noble metal.

Alternatively, the layer of conducting material may be a layer of refractory metal, such as titanium, tantalum, tungsten or molybdenum, noble metal, such as platinum, gold or silver, or other highly conductive metal, such as aluminum or copper. The metal layer may deposited by electron beam evaporation or by sputtering, preferably bias sputtering. The metal layer may be preferentially removed from the bottom of the contact hole and the upper surface of the dielectric isolation layer by anisotropically etching the metal, for example by reactive ion etching, to leave a metal layer only on the side walls of the contact hole.

The layer of conducting material may also be a layer of doped polysilicon formed by low pressure chemical vapour deposition (LPCVD) or a layer of doped amorphous silicon formed by electron beam evaporation or, preferably, by plasma assisted chemical vapour deposition. The polysilicon or amorphous silicon layer may also be anistropically etched to leave a polysilicon or amorphous silicon layer only on the side walls of the contact hole.

The metal plug may be formed of aluminum or of a refractory metal such as tungsten, molybdenum, titanium or tantalum.

The contact region may be heavily doped silicon, heavily doped polysilicon, metal silicide, aluminium alloy or any combination thereof.

BRIEF DESCRIPTION OF THE DRAWINGS

Embodiments of the invention are described below, by way of example only, with reference to the accompanying drawings in which.

DETAILED DESCRIPTION OF EXAMPLE EMBODIMENTS

Figure 1A:
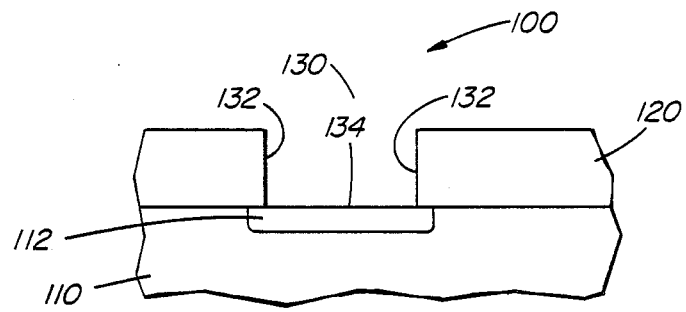
FIGS. 1a–1d are cross-sectional views of a portion of a semiconductor device at successive steps in a first known method for filling a contact hole of the semiconductor device.

Referring to FIG. 1a, a semiconductor device 100 comprises a semiconductor substrate in the form of a silicon substrate 110, a dielectric isolation layer in the form of a silicon dioxide layer 120 on the substrate 110, and a contact hole 130 extending through the silicon dioxide layer 120. The silicon dioxide layer 120 defines side walls 132 of the contact hole 130, and a contact region in the form of a heavily doped region 112 of the substrate 110 defines a bottom 134 of the contact hole 130.

Figure 1B:
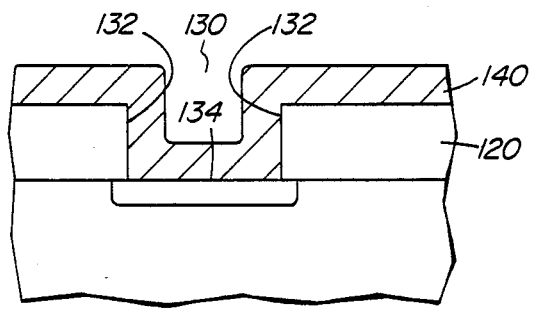

Referring to FIG. 1b, in a first known method for filling the contact hole 130 a thick conformal layer 140 of a refractory metal such as tungsten is deposited by chemical vapour deposition (CVD) over the entire device 100. As the conformal layer 140 is deposited, it thickens inward from the side walls 132 of the contact hole 130 and upward from the bottom 134 of the contact hole 130.

Figure 1C:
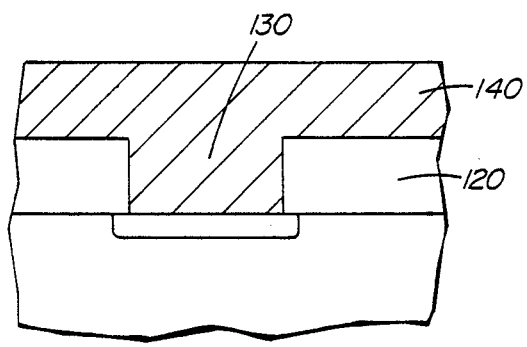

Referring to FIG. 1c, the deposition is continued until the thickness of the conformal layer 140 is sufficient to fill the contact hole 130.

Figure 1D:
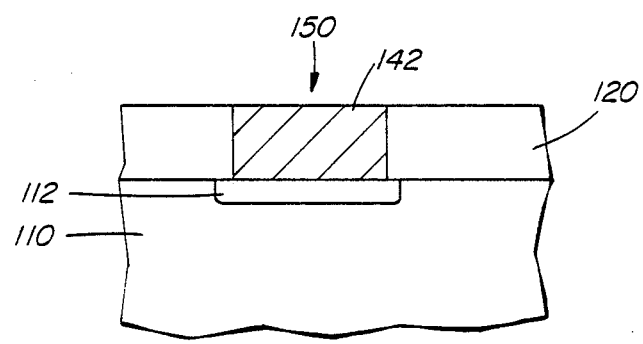

Referring to FIG. 1d, the conformal layer 140 is then etched back to expose the silicon dioxide layer 120 adjacent the contact hole 130 while leaving a tungsten plug 142 in the contact hole 130. The heavily doped region 112 of the substrate 110 and the tungsten plug 142 together comprise a contact structure 150 of the semiconductor device 100.

Figure 2A:
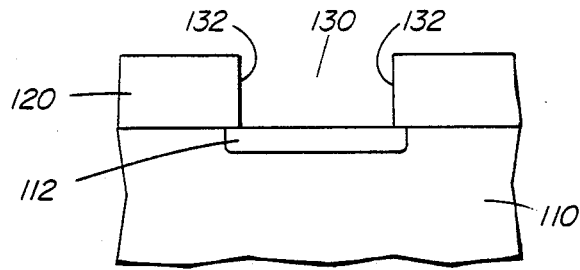
FIGS. 2a–2c are cross-sectional views of a portion of a semiconductor device at successive steps in a second known method for filling a contact hole of the semiconductor device.
Figure 2B:
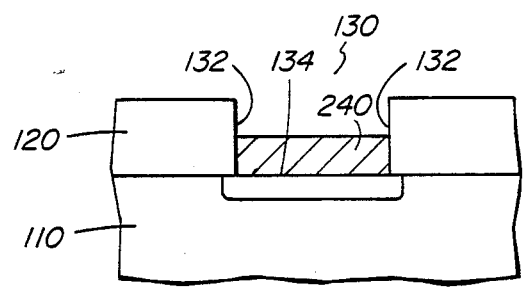
Figure 2C:
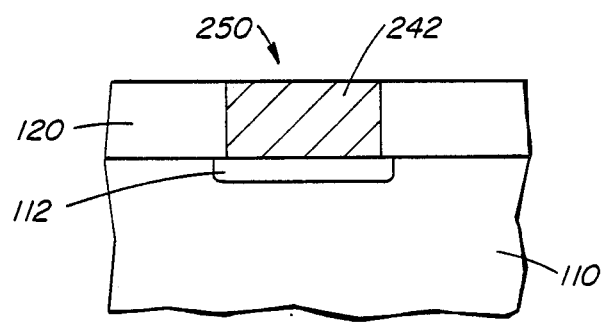

Unfortunately, the conformal CVD and etch back processes are relatively slow, and the deposited tungsten layer 140 must be sufficiently thick to fill the largest contact hole 130 of the semiconductor device 100. Consequently, this first known method of filling contact holes is time consuming, particularly where relatively large contact holes are required. Moreover, the tungsten does not bond well to the side walls 132 of the contact hole 130 and may heave during subsequent process steps, making the contact structure 150 unreliable or defective. Referring to FIGS. 2a–2c, in a second known method of filling the contact hole 130, selective CVD is employed to deposit a layer 240 of refractory metal such as tungsten only on the exposed silicon of the heavily doped region 112 at the bottom 134 of the contact hole 130. As shown in FIG. 2b, the tungsten layer 240 thickens from the bottom 134 of the contact hole 130 upward. As shown in FIG. 2c, the selective CVD is continued until the tungsten layer 240 fills the contact hole 130 to form a tungsten plug 242 which together with the heavily doped region 112 of the substrate 110 comprises a contact structure 250.

Because the tungsten layer 240 is selectively deposited in the contact hole 130, etching of unwanted tungsten is required only when the contact hole 130 is overfilled. However, this second known method is also time consuming since the tungsten layer 240 is selectively deposited only at the bottom 134 of the contact hole 130 and not at the side walls 132. Moreover, the tungsten layer 240 does not bond well to the side walls 132 of the contact hole 130 as in the first known method.

Figure 3A:
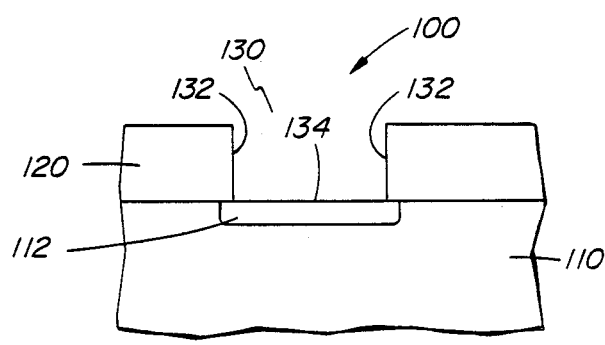
FIGS. 3a–3e are cross-sectional views of a portion of a semiconductor device at successive steps in a method according to an embodiment of the invention for filling a contact hole of the semiconductor device.
Figure 3B:
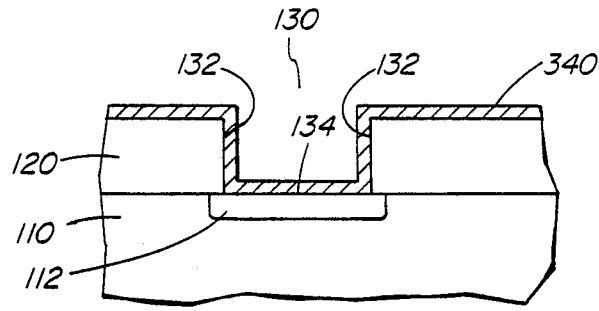
Figure 3C:
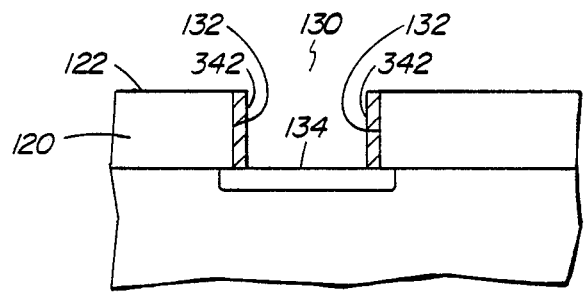
Figure 3D:
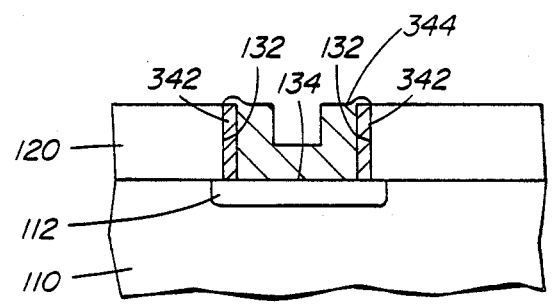
Figure 3E:
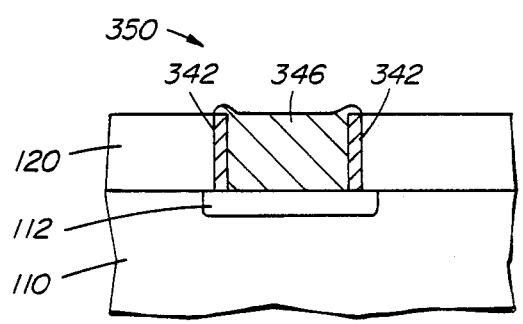

Referring to FIGS. 3a–3e, in a method according to one embodiment of the invention, a conformal layer 340 of tungsten silicide approximately 1000 angstroms thick is deposited by CVD over the entire surface of the device 100 as shown in FIG. 3b. The thin conformal layer 340 is preferentially removed from the bottom 132 of the contact hole 130 and from an upper surface 122 of the silicon dioxide layer 120 by reactive ion etching to leave a layer 342 of tungsten silicide only on the side walls 132 of the contact hole 130 as shown in FIG. 3c. A tungsten layer 344 is then selectively deposited by CVD onto the exposed silicon of the heavily doped region 112 of the substrate 110 defining the bottom 132 of the contact hole 130 and on the tungsten silicide layer 342 on the side walls 132 of the contact hole 130 as shown in FIG. 3d. The tungsten layer 344 thickens from the side walls 132 of the contact hole 130 inward and from the bottom 134 of the contact hole 130 upward until the tungsten layer 344 substantially fills the contact hole 130, as shown in FIG. 3e to form a tungsten plug 346. The heavily doped region 112 of the substrate 110, the tungsten silicide layer 342 and the tungsten plug 346 together comprise a contact structure 350.

The tungsten silicide layer 342 on the side walls 132 of the contact hole 130 improves the adherence of the tungsten plug 346 to the side walls 132 of the contact hole 130. Moreover, the selective deposition of the tungsten layer 344 on the tungsten silicide layer 342 thickens the tungsten layer 344 inward from the side walls 132 of the contact hole 130 as well as upward from the bottom 134 of the contact hole 130. Consequently, the tungsten fills the contact hole 130 more rapidly than in methods in which the tungsten layer thickens only upward from the bottom 134 of the contact hole 130. As the tungsten deposition is selective, no removal of unwanted metal is required unless the contact hole 130 is overfilled.

In an alternative embodiment, the tungsten silicide layer 342 is formed on the side walls 132 of the contact hole 130 by forming the conformal layer 340 of tungsten silicide on the bottom 134 of the contact hole 130, the side walls 132 of the contact hole 130 and the upper surface 122 of the silicon dioxide layer 120 by DC or RF bias sputtering rather than by CVD.

In other alternative embodiments, other refractory metal silicides are substituted for tungsten silicide, for example titanium silicide, molybdenum silicide, tantalum silicide, platinum silicide, chromium silicide, palladium silicide or nickel silicide. Alternatively, a silicide of an alloy comprising a refractory metal and at least one noble metal may be substituted for the tungsten silicide. The silicide layer 342 is preferably between 500 angstroms and 2000 angstroms thick. Alternatively, a layer of metal may be substituted for the silicide layer 342 adhering to the side walls 132 of the contact hole 130. The metal used for such a layer may be a refractory metal, such as titanium, tantalum, tungsten or molybdenum, a noble metal, such as platinum, gold or silver, or another highly conductive metal, such as aluminum or copper. The metal layer may deposited by electron beam evaporation or by sputtering, preferably bias sputtering so as to adhere to the side walls of the contact hole. The metal layer may be preferentially removed from the bottom 134 of the contact hole 130 and the upper surface 122 of the dielectric isolation layer 120 by anisotropically etching the metal, for example by reactive ion etching, to leave a metal layer only on the side walls 132 of the contact hole 130.

A layer of doped polysilicon formed by low pressure chemical vapour deposition (LPCVD) or a layer of doped amorphous silicon formed by electron beam evaporation or, preferably, by plasma assisted chemical vapour deposition may also be substituted for the metal silicide layer 342 adhering to the side walls 132 of the contact hole 130. The polysilicon or amorphous silicon layer may also be anistropically etched to leave a polysilicon or amorphous silicon layer only on the side walls 132 of the contact hole 130.

Other metals, such as aluminum, molybdenum, titanium or tantalum may be substituted for tungsten in forming the plug 346.

Heavily doped polysilicon, metal silicide, aluminium alloy may be substituted for the heavily doped silicon of the substrate 110, or these materials may be combined to define a contact region.

These alternative embodiments are within the scope of the invention as claimed below.

I claim:

1. A method of filling a contact hole of a semiconductor device, said contact hole extending through a dielectric isolation layer of the semiconductor device to expose a contact region of the semiconductor device, the exposed contact region defining a bottom of the contact hole and the dielectric isolation layer defining side walls of the contact hole, the method comprising:
   forming a layer of metal silicide on the side walls of the contact hole, said metal silicide being a silicide of a metal alloy, the alloy comprising a refractory metal and at least one noble metal; and
   selectively depositing metal on the bottom of the contact hole and on the layer of metal silicide on the side walls of the contact hole to substantially fill the contact hole.

2. A method of filling a contact hole of a semiconductor device, said contact hole extending through a dielectric isolation layer of the semiconductor device to expose a contact region of the semiconductor device, the exposed contact region defining a bottom of the contact hole and the dielectric isolation layer defining side walls of the contact hole, the method comprising:
   depositing doped amorphous silicon by plasma assisted chemical vapour deposition on the bottom of the contact hole, the side walls of the contact hole and an upper surface of the dielectric isolation layer;
   preferentially removing the amorphous silicon from the bottom of the contact hole and the upper surface of the dielectric isolation layer to leave a layer of amorphous silicon adhering to the side walls of the contact hole; and
   selectively depositing metal on the bottom of the contact hole and on the layer of amorphous silicon on the side walls of the contact hole to substantially fill the contact hole.

3. A method of filling a contact hole of a semiconductor device, said contact hole extending through a dielectric isolation layer of the semiconductor device to expose a contact region of the semiconductor device, the exposed contact region defining a bottom of the contact hole and the dielectric isolation layer defining side walls of the contact hole, the method comprising:
   depositing doped amorphous silicon by electron beam evaporation on the bottom of the contact hole, the side walls of the contact hole and an upper surface of the dielectric isolation layer;
   preferentially removing the amorphous silicon from the bottom of the contact hole and the upper surface of the dielectric isolation layer to leave a layer of amorphous silicon adhering to the side walls of the contact hole; and
   selectively depositing metal on the bottom of the contact hole and on the layer of amorphous silicon on the side walls of the contact hole to substantially fill the contact hole.

4. A method of filling a contact hole of a semiconductor device, said contact hole extending through a dielectric isolation layer of the semiconductor device to expose a contact region of the semiconductor device, the exposed contact region defining a bottom of the contact hole and the dielectric isolation layer defining side walls of the contact hole, the method comprising:
  forming a layer of metal on the side walls of the contact hole, said metal being a noble metal; and
  selectively depositing metal on the bottom of the contact hole and on the layer of metal on the side walls of the contact hole to substantially fill the contact hole.

* * * * *